(12) United States Patent
Goldmann

(10) Patent No.: US 7,095,614 B2
(45) Date of Patent: Aug. 22, 2006

(54) ELECTRONIC MODULE ASSEMBLY

(75) Inventor: Lewis S. Goldmann, Bedford, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 10/709,190

(22) Filed: Apr. 20, 2004

(65) Prior Publication Data

US 2005/0231918 A1    Oct. 20, 2005

(51) Int. Cl.
*H05K 7/20* (2006.01)

(52) U.S. Cl. ............... 361/704; 361/719; 257/718; 257/727; 165/80.3; 165/185

(58) Field of Classification Search ........... 361/704, 361/719; 257/718, 727; 165/80.3, 185
See application file for complete search history.

(56) References Cited

U.S. PATENT DOCUMENTS

| | | | |
|---|---|---|---|
| 5,430,611 A | | 7/1995 | Patel et al. |
| 5,648,889 A | * | 7/1997 | Bosli ..................... 361/704 |
| 5,949,649 A | | 9/1999 | Bartlow |
| 6,043,981 A | | 3/2000 | Markow et al. |
| 6,229,706 B1 | | 5/2001 | Cook et al. |
| 6,282,093 B1 | * | 8/2001 | Goodwin ................ 361/704 |
| 6,475,011 B1 | * | 11/2002 | Sinha et al. ............. 439/330 |
| 6,757,965 B1 | * | 7/2004 | Colbert et al. ........... 29/836 |
| 6,858,792 B1 | * | 2/2005 | Franz et al. ............. 174/16.1 |

* cited by examiner

*Primary Examiner*—Boris Chervinsky
(74) *Attorney, Agent, or Firm*—DeLio & Peterson, LLC; Kelly M. Nowak; James J. Cioffi (57) ABSTRACT

Methods of engaging an electronic module interconnected to a circuit board to a heat sink using clamping assemblies that maintain integrities of an interconnection grid array and the electronic module. A loading block having a plurality of legs is positioned at a backside of the module toward the circuit board in a location corresponding to a central area of the interconnection grid array. A spring having a central fastening means and plurality of peripheral securing means is positioned adjacent the loading block. The fastening means is actuated whereby central backside compressive forces are directed at and force the loading block against the circuit board, while forces are applied to the securing means for engaging the securing means into the heat sink such that the electronic module is engaged with the heat sink. The clamping assembly relocates the regions of highest compression on the interconnection array, thereby maintaining the integrity thereof.

20 Claims, 4 Drawing Sheets

ELECTRONIC MODULE ASSEMBLY

BACKGROUND OF INVENTION

1. Field of the Invention

The present invention relates generally to the packaging and mounting of semiconductor devices in electronic circuits, and in particular, to a method and apparatus for engaging a module to a heat sink by providing a compressive force that redistributes and controls the compression of ball or column grid array modules.

2. Description of Related Art

Modern electronic modules include chip carriers, or substrates, onto which are mounted microchips and other circuit components, and which in turn, are mounted on printed circuit boards. During normal operating conditions, heat or thermal energy is generated from these microchips and other components. While some low power electronic components are able to dissipate heat generated from standard working conditions directly into the ambient, most require assistance to dissipate generated heat.

Heat sinks are often used to assist high power electronic components to absorb, channel away and dissipate the heat produced from such components during normal operating conditions. In so doing, thermal contact is required between the heat sink and the heat generating component for the effective use of such heat sink.

Figure 1A:
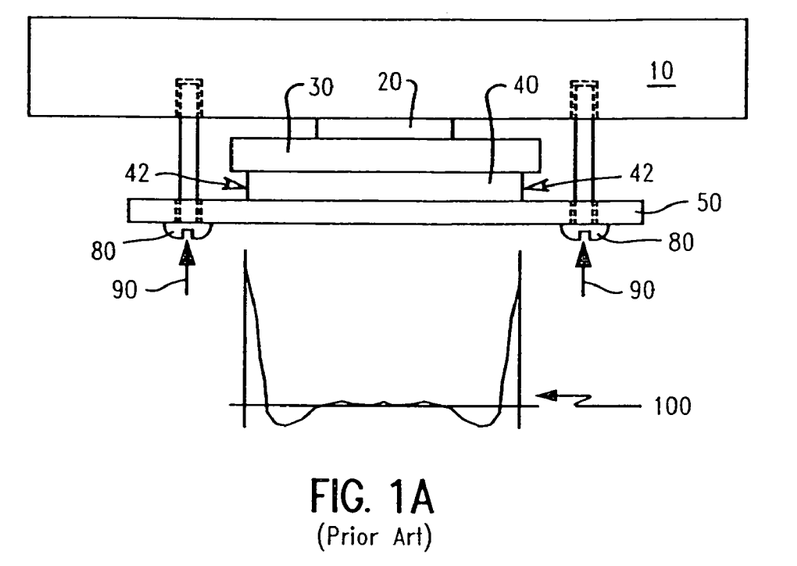
FIG. 1A is a cross sectional view of a prior art illustration of a heat sink engaged with an electronic module whereby pressure between the heat sink and the chip is applied by means of screws through the circuit board outside the perimeter of the module.
Figure 1B:
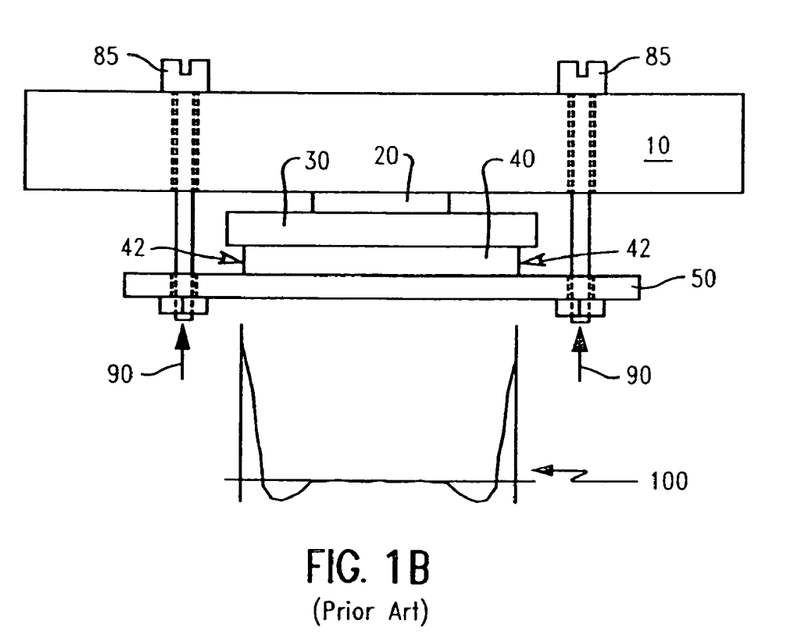
FIG. 1B is a cross sectional view of another prior art illustration of a heat sink engaged with an electronic module whereby pressure between the heat sink and the chip is applied by means of posts from the back of the heat sink which are bolted to the circuit board.

For example, the prior art illustrations of FIGS. 1A and 1B show a heat sink 10 coupled to an electronic module using a thermally conductive material, such as a thermal paste (not shown). The electronic module includes a chip 20 mounted on a chip carrier 30 and is connected to a printed wire board 50 via a solder interconnection array 40, such as a solder ball grid array (BGA) or a solder column grid array (CGA). During normal operations, the heat sink 10 assists in absorbing, channeling away and dissipating the heat produced from such electronic component via the thermally conductive connection there between.

To ensure and maintain the required heat transfer between the heat sink and the die, securing devices, which may include screws, springs, spring loaded screws, clips, clamps, and the like, are typically positioned at four locations such that they reside on an outside perimeter of the chip 20, chip carrier 30, and solder interconnection array 40 as is shown in FIGS. 1A and 1B.

Conventional techniques of securing the heat sink to the electronic component include positioning securing means, such as spring loaded screws 80, to a backside or underside of printed circuit board 50 whereby the securing means traverse through the board and into the underside of heat sink 10 as shown in FIG. 1A. Alternatively, securing means, such as spring loaded screws 85, may be positioned at a backside of the heat sink 10 and traverse there-through, into and through circuit board 50 and secured in position at the backside (underside) of the circuit board via bolts, as is shown in FIG. 1B. Referring to FIGS. 1A and 1B, the forces applied when tightening these conventional securing means 80, 85, whether the securing means be tightened from a backside of the heat sink or from a backside of the circuit board, result in a pressure between the heat sink and the die which ensures good heat transfer.

However, these conventional backside forces 90 undesirably apply high compressive forces to the extremity area of the electronic circuit that surrounds chip 20, chip carrier 30 and solder interconnection array 40 (BGA or CGA), and as such, are primarily applied to solder joints residing at an outside perimeter 42 of the solder interconnection array 40, as illustrated by the compression profiles 100 on the solder interconnection array 40 in FIGS. 1A and 1B. These high compressive forces on solder joints residing at the outside perimeter 42 of the solder interconnection 40 cause such solder joints to creep and thereby change their shape.

As solder balls or solder columns of the interconnection array 40 change shape or flatten, due to these compressive forces 90, the long-term reliability of the solder joint undesirably deteriorates. This is particularly true for the outer solder joints. The deterioration of solder joints results in reduced fatigue lifetime from thermal expansion mismatch among the various components. In extreme cases, creep flattening of the outer interconnections in the array 40 can result in shorting of adjacent interconnections, which represents catastrophic failure of the module itself. The affects of interconnection array 40 shape change or flattening of peripheral solder joints is even more prevalent in thin boards, as such boards bend easily under the action of the conventional backside applied forces 90, which in turn, even further increases pressures applied to the peripheral solder joints. These increased pressures enhance the risk of creep and the ensuing flattening and deterioration in product lifetime.

Accordingly, in order to avoid the problems of creep, flattening and deterioration in product lifetime, it is desirable to maintain the ball shape or column shape of the solder throughout solder interconnection array 40. This will enable the individual interconnections to efficiently accommodate strains generated from the thermal expansion mismatch between the chip carrier 30 and the circuit board 50 during normal working conditions.

Thus, a need continues to exist in the art for improved methods and apparatus for providing thermal and physical contact between a heat sink and chip, thereby enabling good heat transfer between the chip and heat sink, while minimizing bending of the circuit board. These methods and apparatus are preferably inexpensive, easy to assemble and/or disassemble for allowing reworkability or replacement of damaged or inoperative chips, and allow for numerous electronic components to be mounted on the module or on the circuit board.

SUMMARY OF INVENTION

Bearing in mind the problems and deficiencies of the prior art, it is therefore an object of the present invention to provide a method and apparatus that engages a heat sink to a chip for providing physical and thermal contact between such components and enable heat transfer from the chip to the heat sink during normal operating conditions.

It is another object of the present invention to provide a method and apparatus that engages a heat sink to a chip that imposes minimal bending stress on the circuit board.

A further object of the invention is to provide a method and apparatus that engages a heat sink to a chip that avoids solder creeping, distortion and/or flattening, and thereby, maintains the ball or column shape of a solder interconnection.

Still another object of the present invention is to provide a method and apparatus that engages a heat sink to an electronic module that is inexpensive while allowing for numerous electronic components to be mounted on the module and on the circuit board.

Another object of the present invention is to provide a method and apparatus for engaging a heat sink to an electronic module that is easy to assemble and disassemble for allowing reworkability or replacement of damaged and/or inoperative components.

Still other objects and advantages of the invention will in part be obvious and will in part be apparent from the specification.

The above and other objects, which will be apparent to those skilled in art, are achieved in the present invention, which, is directed to in a first aspect a method for maintaining an interconnection grid array of an electronic module while engaging the electronic module to another structure. The method includes positioning a loading block at a backside of the electronic module, providing a spring having a plurality of securing means and positioning this spring adjacent the loading block. A fastening means is then engaged within the spring, such that the fastening means is in alignment with the loading block, and then this fastening means is actuated. Upon actuation, pressures are applied to the loading block for forcing the loading block against the backside of the electronic module, in a location corresponding to a center of the interconnection grid array. Pressures are simultaneously applied to the plurality of securing means for engaging the securing means into another structure for engaging the electronic module with such structure.

In the invention, the electronic module including a chip and a chip carrier is mounted on a circuit board, whereby the chip is in contact with the chip carrier while the interconnection grid array is positioned between the chip carrier and the circuit board. The loading block is then positioned at the backside of the circuit board. The other structure to which the electronic component may be engaged with preferably includes a thermal component, such as a heat sink.

In this aspect of the invention the loading block has a plurality of legs. These legs are directed toward the circuit board located at the backside of the electronic module, whereby each of these legs resides substantially equidistant to the center of the interconnection array. The plurality of legs may be either an even number, or an odd number, positioned on the loading block symmetrically and equidistant with respect to each other. The loading block may be a rigid table having outwardly extending legs or a plate having centrally located upwardly extending protrusions integrally formed therewith. The spring may be an x-spring.

In another aspect, the invention is directed to a method for maintaining an interconnection grid array of an electronic module while engaging the electronic module to a heat sink. The method includes providing the electronic module having, in sequence from a backside thereof, a circuit board, the interconnection grid array, a chip carrier and a chip. A loading block having a plurality of legs is positioned at the backside of the circuit board in a location corresponding to a central area of the interconnection grid array. A spring having a central opening and a plurality of peripheral openings is then provided, and a plurality of securing means are engaged within the peripheral openings, while a fastening means is engaged within the central opening. The spring is positioned under the loading block such that the fastening means is centrally aligned with the loading block and the plurality of securing means are aligned with and traverse through corresponding openings in the circuit board.

Subsequently, pressure is simultaneously applied to both the loading block and the spring by actuating the fastening means. In so doing, pressure on the loading block forces the plurality of legs of the loading block against the circuit board to generate central backside compressive forces directed at the central area of the interconnection grid array. Pressures on the spring are transferred to the plurality of securing means such that the securing means engage the heat sink for coupling the heat sink to the chip. The simultaneous pressures applied to both the loading block and the spring advantageously maintain the integrity of the interconnection grid array.

In this aspect, each of the plurality of legs are in contact with the circuit board in locations that are substantially equidistant with respect to a center of the interconnection grid array. The interconnection grid array may comprise a solder interconnection array of a plurality of solder joints, each having original shapes, whereby these original shapes of the solder joints are substantially maintained in accordance with the invention. In the invention, only the fastening means and securing means directly contact the spring, while only the loading block contacts the circuit board. This is essential as any distortions to the circuit board are prevented in accordance with the invention. A cushioning material may be provided between selected legs of the plurality of legs for evenly distributing the central backside compressive forces across both the loading block and the interconnection grid array. Preferably, the plurality of legs of the loading block reside in an area having a perimeter equivalent to or smaller than perimeters of both the chip and the interconnection grid array.

In yet another aspect of the invention, a clamping assembly is provided for engaging an electronic module to another structure. This clamping assembly includes a loading block having a plurality of legs that is positioned toward a circuit board that is located at a backside of the electronic module. The clamping assembly is located in a location corresponding to a central area of an interconnection grid array. The assembly also includes a spring having a central opening and a plurality of peripheral openings equidistant from the central opening. The spring is adjacent the loading block and does not contact the electronic module. A plurality of securing means are engaged within the plurality of peripheral openings of the spring. A fastening means is engaged within the central opening of the spring such that it is centrally aligned with and in contact with the loading block. The assembly generates central backside compressive forces that direct the loading block against the backside of the electronic module in a location corresponding to the central area of the interconnection grid array such that integrity of the interconnection grid array is maintained, while the plurality of securing means engage the electronic module to another structure.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1A–4 of the drawings in which like numerals refer to like features of the invention.

Figure 2A:
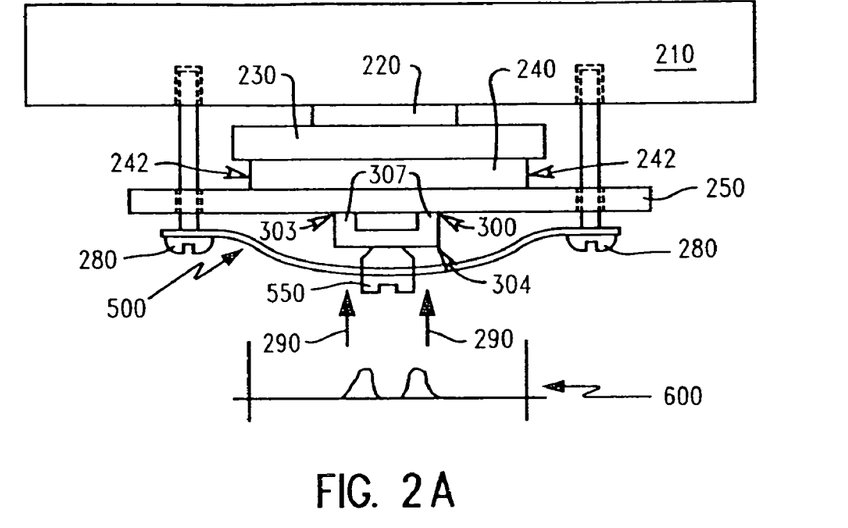
FIG. 2A is a cross sectional view of an electronic module engaged with a heat sink in accordance with the invention whereby the force holding the assembly together is applied in a manner that relocates the region of highest compression on the module via a loading block, such that, bending of the circuit board is avoided, and in turn, high compressive forces on peripheral solder interconnections which can deteriorate interconnection reliability are prevented.
Figure 2B:
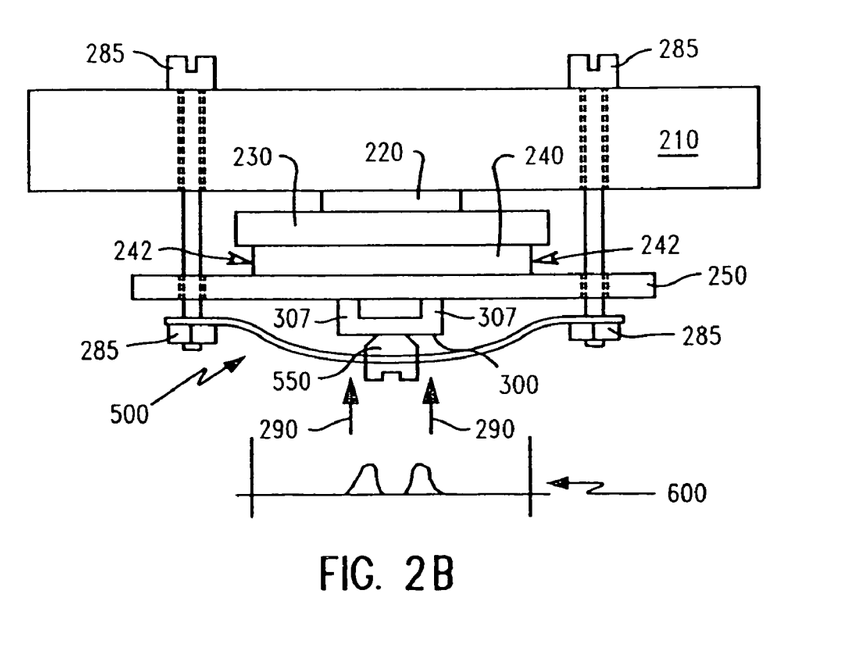
FIG. 2B is a cross sectional view of another embodiment of the invention showing an electronic module engaged with a heat sink whereby the force holding the assembly together is applied in a manner that relocates the region of highest compression on the module via the loading block of FIG. 2A, such that, bending of the circuit board is avoided, and in turn, high compressive forces on peripheral solder interconnections which can deteriorate interconnection reliability are prevented.

Referring to FIGS. 2A and 2B, an electronic module is shown that includes a chip 220 mounted on a substrate or chip carrier 230 by known mounting means, such as C4 connections. The chip carrier is connected to a circuit board 250 via an array of solder interconnections 240, such as a ball grid array (BGA) or a solder column grid array (CGA). In accordance with the invention, the circuit board 250 may be a dense printed wire board having numerous electrical components thereon. During normal operating conditions, the chip generates heat, which may be absorbed, channeled away and dissipated by engaging or coupling a heat sink 210 to the backside of chip 220. The heat sink 210 may be thermally connected to the chip using known thermal agents (not shown), such as a thermal paste.

The present invention is directed to enhancing both the physical and thermal contact between the heat sink 210 and the chip 220 of the electronic module. The invention provides methods and loading apparatus that easily, efficiently and cost effectively engage the printed circuit board 250 to the heat sink 210, while simultaneously minimizing pressures on the solder interconnection array 240. The method and apparatus of the invention applying pressure between the chip and the heat sink, to enhance the heat transfer there between during normal working operations of the electronic module, while significantly reducing solder joint compressions by relocating the region of highest compressions to a more structurally stable, rigid area of the electronic module. The present methods and loading apparatus fixtures relocate the holding force on the circuit board from outside the interconnection array (as shown in FIGS. 1A and 1B) to the middle of the solder interconnection array (as shown in FIGS. 2A–4), while not increasing electronic package costs, nor adversely affecting package reworkability.

In the invention, the loading apparatus fixture includes a loading block 300 having legs 307, fastening means 280, spring 500 and a fastening means 550, such as a screw or a bolt. The spring 500 has a central opening for receiving fastening means 550. In accordance with the invention, when fastening means 550 is provided within the opening of spring 500, and actuated therein, e.g., screwed, rotated, tightened, etc., the fastening means 550 contacts and presses against the loading block 300 to generate forces on legs 307 of the loading block 300. These generated forces on the loading block 300 and legs 307 thereof are transferred to the circuit board, and central backside clamping/compressive forces 290 are generated in a location corresponding to the middle of the interconnection array 240 thereby redistributing and controlling the compression profiles 600 (as compared to compression profiles 100 of the prior art) on the interconnection grid array 240, as shown in FIGS. 2A–4.

Figure 3A:
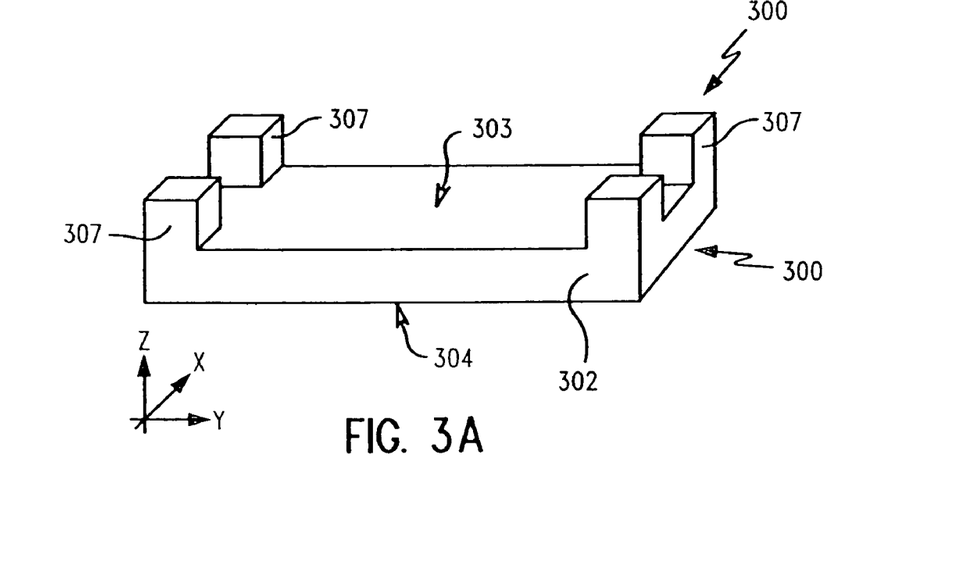
FIG. 3A is a perspective view of the loading block of FIGS. 2A and 2B which permits the force on the underside of the board to be directed at points on the board which are free of attached components.

In a preferred embodiment of the invention, the loading block 300 is composed of a top surface 303 adjacent the circuit board 250 and a bottom surface 304 adjacent the loading block 300. The bottom surface 304 may be substantially planar, while the top surface 303 of the loading block includes a plurality of upwardly extending legs 307. Preferably, the loading block has at least three legs, more preferably four legs as shown in FIG. 3A, extending from the loading block 300 toward the circuit board 250, as shown in FIGS. 2A and 2B. However, it should be appreciated that the loading block may have any number of symmetrically located legs 307 for relieving pressure points along a planar surface of the module.

The legs 307 of the loading block 300 may have a per post force ranging from about 5 pounds per post to about 10 pounds per post such that the total clamping force of the loading block is dependent upon the number of legs 307. For instance, wherein the loading block 300 has four legs 307, the total clamping force of the loading block may range from about 20 pounds per loading block to about 40 pounds per loading block. In the invention, it is desirable that the total clamping force of the loading block 300 be sufficiently high such that it prevents damage from occurring to the thermal interface from impact shock or vibration, such as total clamping forces ranging from about 20 to about 40 pounds per loading block 300. The number of legs 307 of the loading block 300 may also vary, being either an even number or odd number of legs 307. Whether there are an even number or odd number of legs, the legs 307 are preferably symmetrically positioned around the central fastening means 550 for equalizing the fraction of the clamping force transmitted by each leg to the circuit board 250. These locations are selected or predetermined such that they contact locations on the circuit board 250 that do not contain any electrical features or components 700.

Figure 3B:
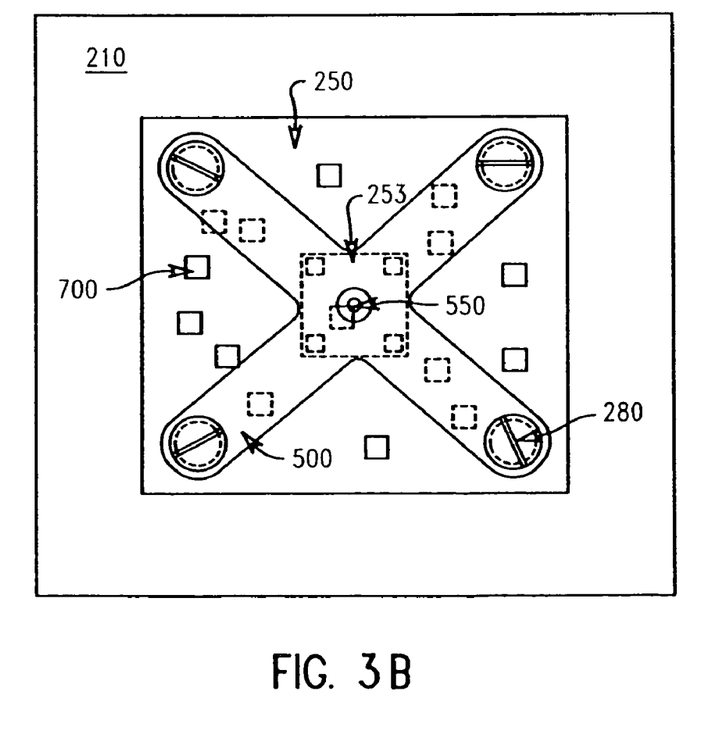
FIG. 3B is a bottom plan view of FIG. 2A showing the loading block of the invention positioned against the circuit board via a spring and fastening means.
Figure 4:
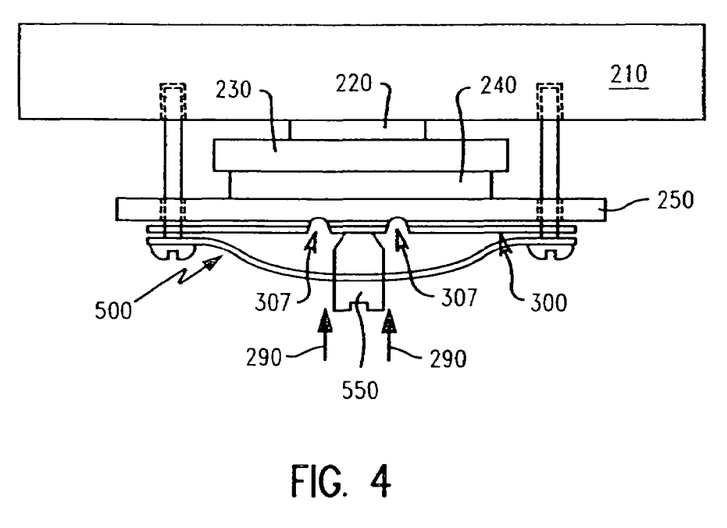
FIG. 4 is a cross sectional view of the invention showing the loading block as a loading block plate for relocating clamping forces on the circuit board in accordance with the invention.

As shown in FIGS. 2A–3B, loading block 300 is depicted as a table having outwardly extending legs. However, the loading block 300 may have a variety of shapes and sizes including, but not limited to, square, rectangular, circular, oval, and the like. The loading block 300 may also be a substantially planar plate having centrally located upwardly extending protrusions or legs 307, as shown in FIG. 4. Loading block 300 may comprise a material including, but not limited to stainless steel, aluminum or iron-nickel alloy, and may be formed by a variety of techniques such as machining, casting or coining. The legs 307 may be integrally formed with the loading block or they may be formed independent thereof, and attached to the base plate of the loading block using a known securing means, such as, screws, pins, bonding agents, and the like. For instance, referring to FIG. 4, wherein the loading block is a substantially planar plate, this plate and protrusions (i.e., legs 307) may be integrally formed with each other by known techniques including, for example, coining, pressing, machining, and the like.

In fabricating the loading block 300, it is preferred that the legs 307 be positioned equidistant from each other, at a sufficient distance, such that the compression fields generated by each leg 307 on the interconnection array 240 do not overlap with each other, as is shown by compression fields 600 in FIGS. 2A–B. Also, the distance between each leg 307 on the loading block may ultimately be dependent upon x, y, z aerial dimensions of the interconnection array 240, and/or upon x, y, z aerial dimensions and rigidity of the circuit board 250. Further, legs 307 must have a sufficient length extending from the loading block 300 toward the circuit board such that the loading block 300 does not contact or interfere with any electrical features or components 700 components residing on the bottom surface of the circuit board 250.

A critical feature of loading block 300 is that the overall x-y planar area that legs 307 (FIGS. 2A–3B) or protrusions (FIG. 4) cover on the block base plate 302 is preferably substantially equal in size to chip 220, or alternatively, smaller in size in comparison to the size of chip 220. However, as shown in FIG. 4, the base plate of the loading block may extend beyond the perimeters of both the chip and the circuit board. As such, upon positioning the loading block 300 at a backside of the circuit board 250, the loading block is aligned with and positioned in a location corresponding to a center location of the interconnection array 240, and preferably chip 220. In so doing, the protrusions or legs 307 of the loading block do not extend beyond the perimeters of either the interconnection array 240 or chip 220, such that, the undesirable bending of circuit board 250 is prevented in accordance with the invention, as discussed in more detail below.

Referring to FIGS. 2A and 2B, once the loading block 300 is provided, it is positioned under the electronic module, particularly at the backside of the circuit board, in a location that corresponds to a center area of the solder interconnection array 240. It is preferred that the legs 307 of the loading block 300 be positioned such that they reside in locations that are substantially equidistant with respect to a center of the solder interconnection array 240. A spring 500 is provided to hold the loading block 300 in position against the backside of the circuit board 250, preferably in the location that is substantially under a central region of the solder interconnection array 240. In so doing, the loading block 300 resides between the circuit board 250 and the spring 500.

The spring 500 is engaged with the fastening means 550, i.e., screw or bolt, substantially at a central location of the spring 500, preferably via threads on the spring and/or the fastening means. In engaging the spring with the fastening means, the fastening means may be rotated or tightened such that it interlocks within the spring 500. As fastening means 550 is rotated or tightened, the fastening means applies pressure to the bottom surface 304 of the load block 300, such that, the load fixture is forced against the circuit board 250 and the region of highest compressions is relocated to the central region of the solder interconnection array 240. While fastening means 550 is being tightened to force such fastening means against the load block, the spring 500 is simultaneously being stretched toward the circuit board such that forces are generated on securing means 280 (FIG. 2A) or securing means 285 (FIG. 2B). These forces applied to securing means 280 or 285 result in the securing means engaging the heat sink 210, and in effect, coupling the heat sink 210 to the chip 220.

In accordance with the invention, an essential feature of spring 500 is that it is a dual functioning spring. That is, the spring is used to position and hold the loading block 300 against the backside (underside) of the circuit board 250. Additionally, spring 500 is simultaneously used to position and hold securing means (e.g., screws 280, 285) for engaging the electronic module to the heat sink 210, as shown in FIGS. 2A and 2B, and coupling the heat sink to the chip. The spring 500 may comprise any of a variety of different shaped springs capable of engaging fastening means 550. For instance, the spring 500 may comprise an x-spring, as depicted in FIG. 3B. A critical feature of the spring 500 is that it should be capable of positioning and holding in place both the fastening means 550 against the loading block 300, and engaging securing means 280/285 to the heat sink 210 for providing the required physical and thermal contact between the heat sink 210 and the chip 220. In the invention, spring 500 is preferably sufficiently flexible such that several screw turns will be required to apply the desired clamping force, preferably in the range 20–40 pounds, to insure a precise load may be applied.

In attaching the heat sink 210 to the chip 220 in accordance with the invention, the spring 500 is positioned at the rear side (underside) of the circuit board 250. Both the heat sink 210 and the circuit board 250 are provided with openings therein corresponding to the number and type of securing means for receiving the same. This may be accomplished by known techniques. The securing means traverse through the openings in the circuit board 250 without contacting any portion of the top surface, bottom surface or internal surface area of the circuit board.

The loading block 300 is positioned between the circuit board 250 and the spring 500 such that the loading block 300 is in a location of the circuit board 250 that corresponds to the central area of the solder interconnection array 240. The fastening means 550 of the spring 500 is positioned under and centrally aligned to the loading block 300. The fastening means 550 directly contacts the bottom surface 304 of the loading block 300 such that the fastening means 550 is symmetrically aligned to and spaced apart from each of the legs 307 of the load fixture. This in effect allows for evenly distributing the pressure load across the load fixture and the central region of the solder interconnection array as shown by the nonoverlapping compression profiles 600 of FIGS. 2A and 2B. Wherein loading block 300 is a spring plate, as shown in FIG. 4, the securing means (280, 285) also traverse through openings in the spring plate for positioning such plate under the circuit board whereby the protrusions (legs 307) are located under the central region of the solder interconnection array 240.

In accordance with the invention, the heat sink 210 is coupled to the chip via spring 500. In so doing, upon engaging and securing, i.e., turning, rotating, tightening, and the like, the fastening means 550 within spring 500, pressure is applied to the loading block 300 such that the loading block is pressed against the backside of the circuit board 250. Simultaneously, upon tightening the fastening means 550 within the spring 500, pressures are also applied to the spring 500 such that the spring is forced toward the backside of the circuit board without contacting the circuit board. These forces exerted on spring 500 are transferred to the securing means (280, 285), which traverse through the openings in the circuit board.

Referring to FIGS. 2A, 2B and 4, the spring 500 positions the securing means (280, 285) at a desired or predetermined distance away from the circuit board 250 such that these securing means, as well as the spring itself, do not contact any portion or exposed surface of circuit board 250. This advantageously avoids any bending or distortion of the circuit board 250 during the present process of engaging heat sink 210 to the chip. As a result of tightening the fastening means 550 within spring 500, the forces exerted on both the spring 500 and securing means (280, 285) attached thereto effect the securing means (280, 285) to engage into and be secured within the heat sink 210, thereby connecting the electronic module to the heat sink, and coupling the heat sink to the chip.

A critical feature is the only component of the invention that directly contacts the backside of the circuit board 250 is the loading block 300; neither the spring 500, fastening means 550 nor the securing means (280, 285) contact any portion of the circuit board. Upon tightening the fastening means 550 within the spring 500, and engaging the securing means (280, 285) into the heat sink, the heat sink has a sufficient rigidity such that when the securing means (280, 285) are engaged therein, the heat sink does not bend or distort, and as such the underlying electronic module does not bend or distort. The only pressures, or forces, exerted upon the electronic module are from the backside of the chip. In particular, these pressures are generated from the loading block 300 being forced against the backside (underside) of circuit board 250 at the central region of the solder interconnection array 240 via tightening of the fastening means 550.

As depicted in FIGS. 2A, 2B and 4, as the loading block 300 is being pressed against the backside (underside) of circuit board 250, at the central region of the solder interconnection array 240, central backside clamping forces 290 are generated and directed toward the backside of the circuit board in a location corresponding to the central region of the solder interconnection array. In accordance with the invention, these central backside-clamping forces 290 are responsible for relocating the region of highest compressions on the electronic module (circuit board) to a more structurally stable area of the electronic module (circuit board), particularly, to the central region of the solder interconnection array 240.

As a result of the highest region compression being at the center of the solder interconnection array 240, peripheral solder joints 242 are protected such that any solder creeping and/or destruction thereof is avoided, as well as maintaining and protecting solder joints across the entire solder interconnection array 240. In so doing, a critical feature of the invention is that spring 500, and securing means 280, 285, are not in direct contact with the circuit board. Rather, the spring 500 communicates with the circuit board only via the legs of the loading block 300.

In accordance with the invention, as the loading block 300 may include a plurality of legs 307, and such loading block 300 directly contacts the backside of the circuit board, all of such legs 307, if exceeding three in number, may not make a planar, uniform, evenly distributed load contact with such corresponding regions across the plane of the circuit board. As such, a cushioning material may be optionally provided between the legs 307 of the loading block 300 and the surface of the circuit board 250 to which such legs 307 make contact.

The cushioning material may include, but is not limited to, an elastomer or elastic material. However, any known material that sufficiently provides padding between two components of an electronic package may be used to provide a planar surface across the areas of contact between legs 307 and circuit board 250 to evenly distribute the pressure load across the loading block 300, and hence, across the solder interconnection array 240 of the electronic module. This relocation of the region of highest compression on the electronic module in accordance with the invention maintains an original shape of the solder joints across the solder interconnection array 240, and thereby maintains the electronic module integrity and reliability.

For example, wherein heat sink 210 is to be coupled to chip 220 of electronic module (220, 230, 240, 250), loading block 300 may include four (4) legs 307 extending from a top surface 303 thereof. The solder interconnection array 240 may be a 24×24 array of solder joints that are spaced about 1 mm apart from each other in an orthogonal direction. The loading block 300 (FIG. 2A–3A) may include an 8 mm×8 mm base plate 302 with the four (4) legs 307 extending there from, each having a length of about 2.5 mm. In accordance with the invention, by coupling the heat sink 210 to the chip 220 using this loading block 300, the region of highest compressions (as compared to the conventional regions of compression in FIGS. 1A–B) is transferred to reside entirely within the perimeters of both the chip 220 and the interconnection solder array 240, as depicted by central backside clamping forces 290. This results in a significant reduction in compression profile 600, as compared to the conventional compression profiles 100 of FIGS. 1A–B, such as by a reduction of about 64%. The compression profile reduction of the present invention in turn advantageously reduces the rate of solder creep by about twenty (20) fold, as compared to the prior art.

Accordingly, the present invention provides for generated clamping forces at a backside of a circuit board, whereby these forces are substantially central to a solder interconnection array, for coupling a heat sink to a chip of an electronic module without damaging the heat sink, the electronic module or any region of the solder interconnection array. An essential feature of the invention is that the shapes of the solder joints, and in particular, those solder joints at the periphery of the interconnection array are maintained, thereby avoiding any solder creeping, distortion and/or flattening of such solder joints. The methods and clamping apparatus of the invention advantageously impose minimal bending stresses on the electronic module, and in particular on the circuit board, such that the integrity, reliability and useful life of the electronic module are extended. Another advantage of the present clamping apparatus is that it is easy to assemble and disassemble for allowing reworkability or replacement of damaged and/or inoperative components of the electronic module.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for maintaining an interconnection grid array of an electronic module while engaging said electronic module to another structure comprising:

providing said electronic module mounted to a circuit board;

positioning a loading block at a backside of said circuit board;

providing a spring having a plurality of securing means;

positioning said spring adjacent said loading block;

engaging a fastening means within said spring such that said fastening means is aligned to said loading block; and actuating said fastening means to apply pressures to said loading block in a location corresponding to a center of said interconnection grid array to maintain integrity of said interconnection grid array, while simultaneously applying pressures to said securing means for engaging said electronic module to said another structure.

2. The method of claim 1 wherein upon said step of actuating said fastening means:

said pressures being applied to said loading block, forcing said loading block against said backside of said circuit board in said location for generating central backside compressive forces for directing an area of highest compressions to said center of said interconnection grid array for maintaining said integrity of said interconnection grid array, and simultaneously, said pressures being applied to said spring, said pressures on said spring being transferred to said plurality of securing means for engaging said electronic module to said another structure.

3. The method of claim 1 wherein said electronic module includes a chip and a chip carrier, said chip being in contact with said chip carrier while said interconnection grid array is positioned between said chip carrier and said circuit board, said loading block being positioned at said backside of said electronic module in contact with said circuit board whereby said central backside compressive forces maintain integrity of said circuit board.

4. The method of claim 1 wherein said another structure is selected from the group consisting of a circuit board, an electronic component, a semiconductor component, and a thermal component.

5. The method of claim 1 wherein said loading block has a plurality of legs, said loading block being positioned so that said plurality of legs are directed toward said circuit board, and each of said plurality of legs reside substantially equidistant to said center of said interconnection array.

6. The method of claim 5 wherein said loading block has an even number of legs, wherein each of said legs is positioned on said loading block symmetrically and equidistant with respect to each other.

7. The method of claim 5 wherein said loading block has an odd number of legs, wherein each of said legs is positioned on said loading block symmetrically and equidistant with respect to each other.

8. The method of claim 1 wherein said spring comprises an x-spring.

9. The method of claim 1 wherein said loading block comprises a rigid table having outwardly extending legs.

10. The method of claim 1 wherein said loading block comprises a plate having centrally located upwardly extending protrusions integrally formed with said plate.

11. A method for maintaining an interconnection grid array interconnecting an electronic module to a circuit board while engaging said electronic module to a heat sink comprising:

providing an electronic module having a chip carrier and a chip mounted to a circuit board via an interconnection grid array;

positioning a loading block having a plurality of legs at said backside of said circuit board in a location corresponding to a central area of said interconnection grid array;

providing a spring having a central opening and a plurality of peripheral openings;

engaging a plurality of securing means within said plurality of peripheral openings of said spring;

engaging a fastening means within said central opening of said spring;

positioning said spring under said loading block such that said fastening means is centrally aligned with said loading block and said plurality of securing means are aligned with and traverse through corresponding openings in said circuit board;

applying pressure simultaneously to said loading block and said spring by actuating said fastening means, whereby said pressure on said loading block forces said plurality of legs of said loading block against said circuit board to generate central backside compressive forces directed at said central area of said interconnection grid array, while said pressures on said spring are transferred to said plurality of securing means to engage said plurality of securing means within said heat sink for coupling said heat sink to said chip, thereby maintaining integrity of said interconnection grid array.

12. The method of claim 11 wherein each of said plurality of legs are in contact with said circuit board in locations that are substantially equidistant with respect to a center of said interconnection grid array.

13. The method of claim 11 wherein said interconnection grid array comprises a solder interconnection array of a plurality of solder joints, each having original shapes, said method substantially maintaining said original shapes of said plurality of solder joints.

14. The method of claim 11 wherein only said fastening means and said securing means directly contact said spring, thereby preventing any distortions to said circuit board during said method.

15. The method of claim 14 wherein only said loading block contacts said circuit board.

16. The method of claim 11 further including a cushioning material between selected legs of said plurality of legs to provide a planar contact between said plurality of legs and said circuit board for evenly distributing said central backside compressive forces across said loading block and said interconnection grid array.

17. The method of claim 11 wherein said plurality of legs of said loading block reside in an area having a perimeter equivalent to or smaller than perimeters of both said chip and said interconnection grid array.

18. A clamping assembly for engaging an electronic module to another structure comprising:

an electronic module mounted to a circuit board via an interconnection grid array;

a loading block having a plurality of legs, said loading block positioned at a backside of said electronic module, toward said circuit board, in a location corresponding to a central area of said interconnection grid array;

a spring having a central opening and a plurality of peripheral openings equidistant from said central opening, said spring being adjacent said loading block without contacting said electronic module or said circuit board;

a plurality of securing means engaged within said plurality of peripheral openings of said spring; and a fastening means engaged within said central opening of said spring, said fastening means being centrally aligned with and in contact with said loading block, whereupon said assembly generates central backside compressive forces that direct said loading block against said circuit board in said location corresponding to said central area of said interconnection grid array such that integrity of said interconnection grid array is maintained, while said plurality of securing means engage said electronic module to said another structure.

19. The assembly of claim 18 wherein said loading block comprises a planar plate having said plurality of legs integrally formed therewith.

20. The assembly of claim 18 wherein said loading block comprise a rigid structure having outwardly extending legs.

* * * * *